(12) United States Patent
Ohashi et al.

(10) Patent No.: US 7,307,350 B2
(45) Date of Patent: Dec. 11, 2007

(54) INTEGRATED CIRCUIT CHIP BONDING SHEET AND INTEGRATED CIRCUIT PACKAGE

(75) Inventors: Kazuhiko Ohashi, Okayama (JP); Osamu Yokomizo, Okayama (JP); Koji Yoshida, Okayama (JP)

(73) Assignee: Japan Gore-Tex, Inc., Tokyo (JP)

( * ) Notice: Subject to any disclaimer, the term of this patent is extended or adjusted under 35 U.S.C. 154(b) by 0 days.

(21) Appl. No.: 10/175,141

(22) Filed: Jun. 19, 2002

(65) Prior Publication Data

US 2003/0020178 A1 Jan. 30, 2003

(30) Foreign Application Priority Data

Jun. 20, 2001 (JP) ............... 2001-186941

(51) Int. Cl.
*H01L 23/48* (2006.01)
*H01L 23/52* (2006.01)
*H01L 29/40* (2006.01)

(52) U.S. Cl. ................ 257/783; 257/E23.002
(58) Field of Classification Search ........ 257/783; 438/118; 428/343, 344, 355 R, 355 EP, 428/304.4, 308.4, 317.1, 317.3, 317.7
See application file for complete search history.

(56) References Cited

U.S. PATENT DOCUMENTS

| | | | | |
|---|---|---|---|---|
| 5,126,192 A | * | 6/1992 | Chellis et al. | 428/323 |
| 5,270,571 A | * | 12/1993 | Parks et al. | 257/686 |
| 5,376,453 A | * | 12/1994 | von Gentzkow et al. | 428/415 |
| 5,652,055 A | * | 7/1997 | King et al. | 428/343 |
| 5,879,794 A | | 3/1999 | Korleski, Jr. | 428/317.1 |
| 5,932,345 A | * | 8/1999 | Furutani et al. | 428/364 |
| 6,051,778 A | * | 4/2000 | Ichinose et al. | 136/256 |
| 6,090,484 A | * | 7/2000 | Bergerson | 428/355 |
| 6,114,753 A | * | 9/2000 | Nagai et al. | 257/668 |

FOREIGN PATENT DOCUMENTS

| | | |
|---|---|---|
| JP | 1998022325 A | 1/1998 |
| JP | 10 064927 | 3/1998 |
| JP | 1998340968 A | 12/1998 |
| JP | 199279378 A | 10/1999 |
| JP | 2000080251 A | 3/2000 |
| JP | 2000154356 A | 6/2000 |
| JP | 2000219799 A | 8/2000 |
| WO | WO 97/17410 | 5/1997 |

* cited by examiner

*Primary Examiner*—David A. Zarneke
(74) *Attorney, Agent, or Firm*—Allan M. Wheatcraft

(57) ABSTRACT

An IC chip bonding sheet having adhesive resin layers formed on both faces of a porous polytetrafluoroethylene layer comprising a porous polytetrafluoroethylene sheet, the porous polytetrafluoroethylene layer retaining porous voids, and the adhesive resin layers comprising a bromine-free flame retardant resin composition.

8 Claims, 1 Drawing Sheet

INTEGRATED CIRCUIT CHIP BONDING SHEET AND INTEGRATED CIRCUIT PACKAGE

FIELD OF THE INVENTION

The present invention relates to an integrated circuit ("IC") chip bonding sheet and an IC package, and in particular to a flame retardant, reliable IC chip bonding sheet employing porous polytetrafluoroethylene sheeting and a flame retardant resin composition, and an IC package employing same.

BACKGROUND OF THE INVENTION

As electronic component mounting densities have increased, mounting techniques known as "chip scale package" and "chip size package" in which the dimensions of the semiconductor mounting substrate are about the same as the semiconductor chip dimensions, have attracted interest. For example, as shown in FIG. 1, a semiconductor chip 1 is bonded by adhesive 3 to a mounting substrate 2 having the same dimensions, solder balls (interconnect pads) 4 are formed on the back face of mounting substrate 2, and the semiconductor chip 1 and solder balls 4 are interconnected by wire bonding 5 using an opening made in the center of the mounting substrate 2, for example. As shown in FIG. 2, the wire bonding 5 is sometimes formed using the outside of the semiconductor chip 1. In FIG. 2, there is a copper foil pattern 6 on the surface of substrate 2, interconnecting the wire bonding 5 and solder balls 4. Or, as shown in FIG. 3, an opening in the interior of the semiconductor chip 1 can be used for formation. In this case an extension 7 of the copper foil pattern is used for interconnection of the semiconductor chip 1 and solder balls 4.

Bonding of the semiconductor chip and mounting substrate in this kind of semiconductor chip package can be accomplished with liquid adhesive, but adhesive sheets are used due to ease of control in fabrication processes. The adhesive sheet may be an adhesive of sheet form, but typically one having adhesive layers formed on both sides of a heat resistant base material or core material is used. Heat resistant base materials and core materials used include polyimide resin, polycarbonate, polyester, polytetrafluoroethylene, polyethylene, polypropylene etc.; in addition to solid sheets, the use of porous sheets is also known. Epoxy resin is a typical adhesives although maleimide, cyanate or other resins are also used (Unexamined Patent Application 10-340968, Unexamined Patent Application 2000-154356, Unexamined Patent Application 10-22325 etc.).

Adhesives for use in conventional IC chip bonding sheets consist exclusively of materials containing bromine to impart flame retardance. However, in recent years improvements in global consciousness with regard to environmental problems has led to strong demand from the market for products that do not contain bromine or other substances that can emit toxic gases when burning.

Accordingly it is an object of the present invention to provide an IC chip bonding sheet that while employing bromine-free adhesive resin nevertheless offers high flame retardance, as well as reliable performance in terms of heat resistance, humidity resistance, resistance to thermal expansion etc., and an IC package employing same.

SUMMARY OF THE INVENTION

The present invention provides an IC chip bonding sheet comprising
  a. a porous polytetrafluoroethylene layer comprising a porous polytetrafluoroethylene layer comprising a porous polytetrafluoroethylene sheet having
    i. porous voids therein
    ii. a first surface
    iii. a second surface, and
  b. an adhesive resin layer comprising a bromine-free flame retardant resin composition on each of the first surface and the second surface.

The adhesive resin layer is preferably an adhesive resin sheet laminated to the porous polytetrafluoroethylene layer, and more preferably a porous polytetrafluoroethylene sheet impregnated with adhesive resin laminated to said porous polytetrafluoroethylene layer. The flame retardant resin composition has a JIS-K-7201 oxygen index of 25 or greater and a flame retardance of VTM-1 or higher as measured by UL94 flammability test method. Each adhesive resin layer is preferably 5-70 μm thick and preferably contains phosphorus where the total phosphorus content of the IC chip bonding sheet is 0.08-1.0 mass %. The total polytetrafluoroethylene content of the IC chip bonding sheet is preferably 60 mass % or above.

In another aspect, the present invention provides an IC package comprising an IC chip bonded to a mounting substrate by the IC chip bonding sheet described above.

DETAILED DESCRIPTION OF THE INVENTION

The IC package (actually a large-scale integrated ("LSI") package, but termed broadly herein "IC package") in which the invention is embodied may be, for example, a QXP (quad flat package), BGA (ball grid array), CSP (chip size package) etc., but in any case is an IC package of a type in which the IC chip and IC chip mounting substrate are bonded and affixed. The IC chip bonding sheet herein is used principally in packages in which the dimensions of the IC chip mounting substrate and the dimensions of the IC chip are about the same, but is not limited thereto.

The invention employs, as an IC chip bonding sheet in such an IC package, an IC chip bonding sheet having adhesive resin layers formed on both faces of a porous polytetrafluoroethylene layer comprising a porous polytetrafluoroethylene sheet, the porous polytetrafluoroethylene layer having porous voids, and the adhesive resin layers comprising a bromine-free flame retardant resin composition.

The invention features a porous polytetrafluoroethylene sheet as the core material, provided on both sides with adhesive resin layers, while retaining porous voids 11a. Typically, IC chip bonding sheets consist of a sheet of polyimide, polyethylene etc. coated with layers of epoxy resin. The use of porous polytetrafluoroethylene as core material herein provides an IC chip bonding sheet that, while using bromine-free flame retardant resin, nevertheless has high flame retardance and other needed qualities.

The porous polytetrafluoroethylene layer consists of a single layer or multiple layers of porous polytetrafluoroethylene sheeting. Polytetrafluoroethylene has a high melting point, techniques for processing it are quite developed, and porous polytetrafluoroethylene sheeting obtained by a stretching process is the most desirable material. As a result, it is possible to obtain an IC chip bonding sheet having higher flame retardance, in addition to the non-flammability of polytetrafluoroethylene per se. Porous polytetrafluoroethylene sheeting also has the advantages of being able to use bonding techniques that utilize the high heat and humidity resistance and anchoring effect of the material. Since the substrate consists of porous polytetrafluoroethylene sheeting, it is pliable and homogenous, providing the advantage of ease of handling.

Porous polytetrafluoroethylene sheet thickness is typically 10 µm -1 mm, and preferably 100-200 µm. Thickness exceeding 1 mm will result in a high IC package that is not practical, while with less than 10 µm adequate passage for water vapor cannot be assured. Where a single porous polytetrafluoroethylene sheet does not meet the required sheet thickness, a plurality of sheets may be stacked together. The plurality of stacked sheets may be fused and unified using a gravure pattern roll, hot press unit or the like.

Figure 4:
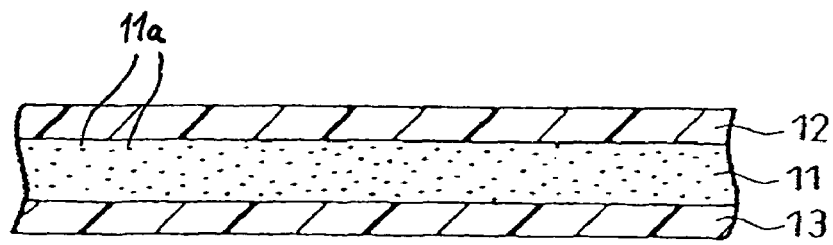
FIG. 4 shows an IC chip bonding sheet of the invention.

Referring to FIG. 4, a porous polytetrafluoroethylene sheet 11 of this kind is used as core material, coating either side thereof with adhesive resin as adhesive resin layers 12, 13, or laminating adhesive resin sheets thereto.

The adhesive resin layers consist of adhesive resin. The principal component of the adhesive resin herein can be selected from polymer resins that are thermoplastic or thermosetting resins with bonding action, examples being epoxy resin, BT resin, polyimide resin, cyanate resin, silicone resin, fluororesin (FEP, PFA etc), polyamide resin, acrylic resin or the like, or blends of these resins. More specific, non-limiting examples of principal components are cresol novolak epoxy resin, phenol novolak epoxy resin, bisphenol A epoxy resin, bisphenol F epoxy resin, alcohol ether epoxy resin, glycidylamine epoxy resin, polyimide resin, polycarbonate resin, bismaleimide-triazine resin, silicone resin, elamine resin, urea resin, diallyl phthalate resin, unsaturated polyester resin, nylon resin, and polyester resin; any resin that does not contain bromine may be used. These principal components may be used individually, or several may be combined freely. The bonding sheet herein is interposed between the IC chip and the IC chip mounting substrate, with the adhesive resin layers thereof fused and hardened with the porous polytetrafluoroethylene sheet which is the substrate of the sheet retaining its shape, to bond and affix the IC chip and substrate together. Accordingly in preferred practice the adhesive resin used for the adhesive resin layer will have a lower melting point than the porous polytetrafluoroethylene sheet which is the substrate.

Optionally, a hardener may be used, non-limiting examples of such hardeners being 2-methyl imidazole, 2-methyl-4-ethyl imidazole, 2-phenyl imidazole, dimethylaminomethyl phenol, benzyldimethylamine, methylene dianiline, diethylenetriamine, dicyandiamide, or alkyleneamine based compounds, and organic acid anhydrides etc., used individually or with several kinds mixed freely.

The resin compositions used herein must be bromine-free, as used herein, bromine-free referring to bromine content of no more than 0.09 mass %. Resin composition bromine content may be analyzed using, for example, the waste gas bromine analysis method of JIS-K-0085, for waste gases from resin combustion.

While the bromine-free resin compositions used herein must be flame retardant, from the standpoint of flame retardance, JIS K 7201 oxygen index of 25 or greater is preferred, and more preferably an oxygen index of 28 or above. The oxygen index is an index indicating flame retardance on the basis of the concentration of oxygen required for sustained combustion of the resin composition; a higher value denoted higher flame retardance.

The bromine-free resin compositions used herein may have admixed into the resin phosphorus, nitrogen compounds or other flame retardants, inorganic fillers and the like, in order to achieve the required level of flame retardance; consist of resins or resin compositions devoid of such additives, but having improve flame retardance; or mixtures of such resin (compositions) with flame retardants, inorganic fillers and the like.

The flame retardant resin compositions herein may contain phosphorus, nitrogen or other non-halogen compounds, silica, aluminum hydroxide or other inorganic fillers, or other such flame retardants, the effect of addition of which is not only flame proofing of the resin, but also imparting characteristics required for applications.

The resin as the principal component herein may be selected, for example, from among the flame retardant, non-halogenated resin compositions disclosed in Unexamined Patent Application 11-279378, Unexamined Patent Application 2000-219799, Unexamined Patent Application 11-279378, Unexamined Patent Application 2000-80251 etc., mainly epoxy resins containing aromatic groups. By using such bromine-free flame retardant resins as principal components, at a minimum the amount of flame retardants, inorganic fillers etc. required can be reduced, and in some cases eliminated. Where separate addition of flame retardants, inorganic fillers etc, is not required herein, the production process is simplified, and such an embodiment is one preferred embodiment.

Because the substrate is porous polytetrafluoroethylene, the IC chip bonding sheet herein can provide both high flame retardance and excellent physical qualities even without the use of specialty resins such as those mentioned hereinabove as bromine-free, flame retardant resin compositions, instead composing the resin composition by adding flame retardants, inorganic fillers, etc.

Flame retardants include non-halogen flame retardants, especially those containing condensed phosphate esters, monomer type phosphate esters, reactive phosphate esters, or inorganic phosphorus based phosphorus, those containing melamine, guanidine or other nitrogen compounds, expanding graphite and other organic compounds, or silica, alumina, talc, calcium carbonate, titanium white, kaolin clay, Bengal, magnesium hydroxide, aluminum hydroxide, calcium hydroxide, dawsonite, calcium aluminate, zinc borate and other inorganic fillers.

However, in a preferred embodiment herein, a phosphate based flame retardant is used as the flame retardant, or a phosphorus-containing flame retardant resin is used. Since inorganic flame retardants are not soluble in solvents, processes such as particle size reduction, dispersion etc. will be required, which entails some inconvenience, whereas most phosphorus systems are soluble in solvents, and some of them are chemically reactive with resins, which is extremely useful in terms of rendering synthetic resins flame retardant. Accordingly, in preferred practice, a phosphorus system will be used as the flame retardant, and inorganic flame retardants will not be included.

As regards elemental phosphorus content, according to the invention, it has been discovered that a percentage of elemental phosphorus in the IC chip bonding sheet of 0.08-1.0 mass %, preferably 0.1-0.6 mass %, and more preferably 0.12-0.45 mass %, is especially preferable in IC chip bonding sheets having the arrangement herein. Here, if elemental phosphorus content is less than 0.08 mass % flame retardant action will not be sufficient. According to the invention it has been discovered that there is a correlation between the phosphorus content contained in the bonding sheet and the humidity resistance of the bonding sheet, and if elemental phosphorus content is above a certain given amount, the humidity resistance of the bonding sheet will not be adequate, which poses the risk of depressing bonding reliability, and in particular the upper limit for phosphorus content to assure adequate bonding reliability thereof is an amount considerably less than that normally predicted. The upper limit for phosphorus content is a value selected from this viewpoint.

Total polytetrafluoroethylene (PTFE) content herein is preferably at least 60 mass %. This is because if less than 60 mass %, flame retardance cannot be maintained unless phosphorus content is increased.

The resin compositions herein, within the scope and spirit of invention, may optionally contain, besides flame retardants, hardeners, fillers, surfactants added for the purpose of improving affinity with the substrate, or the like, added to the resin for the resin composition.

The bromine-free, flame retardant resin composition is coated or laminated to both sides of the porous polytetrafluoroethylene sheet which is the substrate. It is possible to obtain an IC chip bonding sheet having, in addition to the non-flammability of porous polytetrafluoroethylene per se, higher flame retardance, and also other characteristics.

As methods for forming the adhesive resin layer, it can be obtained by coating as a solvent solution of the adhesive resin, a thermosetting resin of epoxy resin, BT resin, polyimide resin, thermosetting PPE resin, cyanate resin or other thermosetting resin dissolved in MEK, NMP, toluene or other such solvent onto a porous polytetrafluoroethylene sheet, and eliminating the solvent heating and drying. As a melt of adhesive resin, it can be obtained by heating PPE resin, PPO resin, acrylic resin, polyamide resin or other thermoplastic resin to give a melt, which is coated, for example, using a hot melt process. Additionally, the bonding sheet herein may be formed using a laminating process, placing epoxy resin based, acrylic resin based or other such resin sheeting, or bonding sheeting of porous polytetrafluoroethylene sheeting impregnated with epoxy resin etc., against each side of the porous polytetrafluoroethylene layer, and then processing this by means of a hot press, hot roll etc., to melt and harden the adhesive resin and unify it with the porous polytetrafluoroethylene layer. It is especially preferred to laminate bonding sheeting of porous polytetrafluoroethylene sheeting impregnated with adhesive resin to the porous polytetrafluoroethylene layer. With this method, thickness of the IC chip bonding sheet can be controlled precisely, and during adhering of the IC chip and IC chip bonding sheet by hot pressing, resin flow can be controlled to a suitable degree.

Regardless of the method used, the porous polytetrafluoroethylene layer must retain its porous spaces (voids). Accordingly, methods wherein adhesive resin is injected throughout the thickness direction of the porous polytetrafluoroethylene layer cannot be employed herein. In consideration of improving reliability through stress relaxation and breathability of the core material composed of the porous polytetrafluoroethylene layer, the proportion of core thickness in the bonding sheet is at least 30%, preferably at least 50%, and especially at least 70%. If the proportion of core thickness in the bonding sheet is less than 30%, it will exhibit substantially no stress relaxation, and may not readily allow escape of gases emitted from the adhesive layers, posing the risk of depressing bonding reliability during thermal cycling. Also, porous voids are preferably formed homogeneously through the entire adhesive sheet. Further, the ratio of porous polytetrafluoroethylene layer to adhesive resin layer thickness affects control of phosphorus content. In terms of improving these required qualities and controlling performance, the ideal method is laminating adhesive sheeting of porous polytetrafluoroethylene sheeting impregnated with adhesive resin to the porous polytetrafluoroethylene layer.

Adhesive resin layer thickness is typically 5-70 µm, preferably 10-50 µm, and especially 15-40 µm. In excess of 70 µm the proportion of resin versus the adhesive sheet increases so that the total amount of flame retardant increases as well, and the balance of qualities required of the adhesive sheet becomes difficult to achieve. With less than 5 µm, there is a risk of inadequate adhesive force, and inadequate pattern embedding of copper foil etc.

Figure 1:
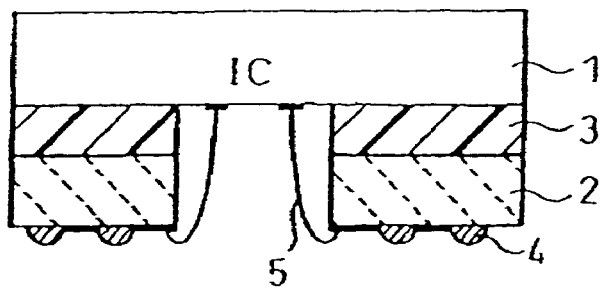
FIG. 1 shows an example of a ball grid array IC package.
Figure 2:
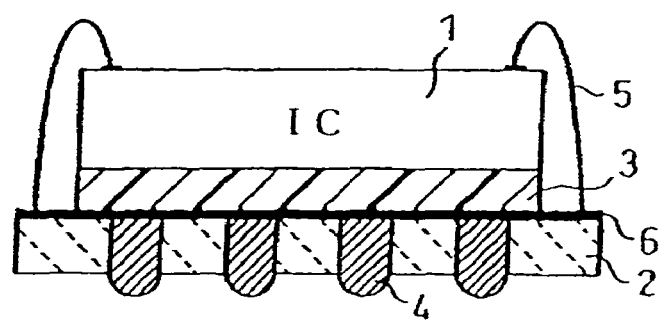
FIG. 2 shows an example of a ball grid array IC package.
Figure 3:
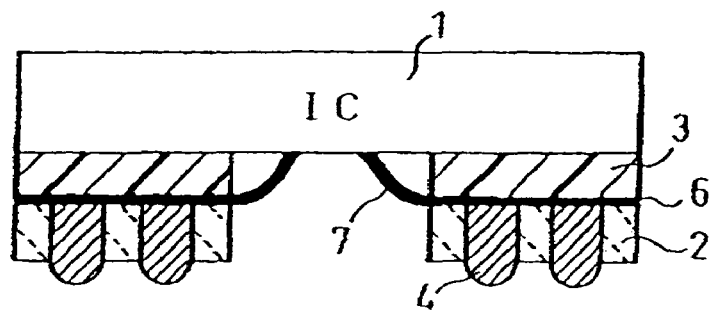
FIG. 3 shows an example of a ball grid array IC package.

The IC chip is mounted on an IC chip bonding sheet using this bonding sheet (see FIGS. 1-3). Here, one, or, if necessary, two or more layers of bonding sheeting herein obtained in the above manner are stacked. Where two or more layers are stacked, the adhesiveness of the sheeting per se facilitates unification. The IC chip mounting substrate can be any substrate having thermal dimensional stability, for example, a PI film, ceramic substrate, lead frame, glass resin substrate, aramid fiber substrate or liquid crystal film.

IC packages using the bonding sheet herein can be used in the above mode, or provided on required sides thereof with protective frames for protecting the IC chip, if so required.

As shown in FIGS. 1-3, the bonding sheet herein is used between an IC (LSI) chip 1 and an IC (LSI) chip mounting substrate 2. In bonding sheet 3 the adhesive resin layers are formed on the surfaces of the porous polytetrafluoroethylene layer whose center portion is cross sectional direction thereof is composed of porous polytetrafluoroethylene only, and retains porous voids; and with the adhesive resin layers composed of a bromine-free, flame retardant resin composition.

By means of this, as noted, a high degree of flame retardance can be maintained without the adhesive resin containing undesirable bromine, and there can be obtained an IC chip bonding sheet that excels in heat resistance, humidity resistance and other characteristics.

The IC chip bonding sheet herein also features resilience in the both the cross sectionals and planar directions, and breathability. Since it has resilience, it can absorb strained produced by a difference in thermal expansion between the chip and the mounting substrate, thus resolving the conventional problem of cracking or adhesive separation of the IC chip bonding portion. In the IC chip bonding sheet herein the porous polytetrafluoroethylene layer situated in the central portion in the thickness direction retains porous voids and thus has breathability, so that moisture adsorbed by the adhesive resin layers and subsequently vaporized in solder reflow processes or the like will escape to the outside via the porous polytetrafluoroethylene layer, preventing the problem of package cracking. As regards IC (LSI) packages in which the bonding sheet herein is used for bonding an IC (LSI) chip and an IC (LSI) chip mounting substrate, bonding reliability of the IC (LSI) chip is improved, and there is also the benefit of no package cracking during solder reflow etc.

EXAMPLES

Example 1

60 mass parts of a bisphenol A type epoxy resin (EPO-TOOTO YD-8215 from Toto Kasei KK) as the principal component, 70 mass parts of phenol novolak resin (FENO-RAITO LA-7054 (nonvolatile component 60%) from Dainippon Ink & Chemical), 1 mass part of 2-ethyl 4-methylimidazole 10% methyl ethyl ketone solution, and 25 mass parts of condensed phosphate ester (PX-200 from Daihachi Kagaku KK). Methyl ethyl ketone was added to give the varnish a 50% nonvolatile content, to produce a concentrated preparation. A porous PTFE layer of GORE-TEX® (from Japan Gore-Tex) sheeting (200 μm thick, 45% porosity) was dipped in the composition and dried for 7 minutes at 150° C., to give an IC chip bonding sheet coated on each side with a 30 μm-thick layer of epoxy resin, and having voids preserved in its central portion.

Example 2

A composition consisting of the same flame retardant resin composition as in Example 1 was applied to one side of a GORE-TEX® sheet similar to that in Example 1, and dried for 5 minutes at 150° C. The other face was then again coated using a roll coater, and dried for 5 minutes at 150° C. to give an IC chip bonding sheet coated on each side with epoxy resin 24 μm thick.

Example 3

A composition consisting of the same flame retardant resin composition as in Example 1 (nonvolatile content 40%) was dip-impregnated into a GORE-TEX® sheet (20 μm thick, 60% porosity), then dried for 5 minutes at 150° C. to give a bonding sheet 20 μm thick. This material was applied to both sides of GORE-TEX sheet similar to that in Example 1. Release paper was then applied over both sides thereof, and the assembly was subjected to pressing with a hot press under conditions of 130° C., 3 kg/cm², 3 min, to give an IC chip bonding

Example 4

A composition was prepared by combining as the principal ingredient 62 mass parts of a cresol novolak epoxy resin (EPICLON N-665 EXP from Dainippon Ink & Chemicals), 64 mass parts of phenol novolak resin hardener (PHENO-LITE LA-7054 (nonvolatile content 60%) from Dainippon Ink & Chemicals), 1 mass part of 2-ethyl 4-methyl imidazole 10% methyl ethyl ketone solution, and 25 mass parts of condensed phosphate ester (PX-200 ex Daihachi Kagaku KK). An IC chip bonding sheet was then produced as in Example 1.

Example 5

A composition was prepared by combining as the principal ingredient 60 mass parts of bisphenol A epoxy resin (EPOTOTE YD-8125 from Toto Kasei KK), 70 mass parts of phenol novolak resin hardener (PHENOLITE LA-7054 (nonvolatile content 60%) from Dainippon Ink & Chemicals), 1 mass part of 2-ethyl 4-methyl imidazole 10% methyl ethyl ketone solution, and 100 mass parts of condensed phosphate ester (PX-200 from Daihachi Kagaku KK). An IC chip bonding sheet was then produced as in Example 1.

Comparison 1

A composition was prepared by combining as the principal ingredient 60 mass parts of bisphenol A epoxy resin (EPOTOTE YD-8125 from Toto Kasei KK), 70 mass parts of phenol novolak resin hardener (PHENOLITE LA-7054 (nonvolatile content 60%) from Dainippon Ink & Chemicals), and 1 mass part of 2-ethyl 4-methyl imidazole 10% methyl ethyl ketone solution. An IC chip bonding sheet was then produced as in Example 1.

Comparison 2

A composition was prepared by combining as the principal ingredient 60 mass parts of bisphenol A epoxy resin (EPOTOTE YD-8125 from Toto Kasei KK), 70 mass parts of phenol novolak resin hardener (PHENOLITE LA-7054 (nonvolatile content 60%) from Dainippon Ink & Chemicals), 1 mass part of 2-ethyl 4-methyl imidazole 10% methyl ethyl ketone solution, and 9 mass parts of condensed phosphate ester (PX-200 from Daihachi Kagaku KK). Methyl ethyl ketone was added to give the varnish a 35% nonvolatile content, to produce a concentrated preparation. A porous PTFE layer of GORE-TEX® (from Japan Gore-Tex) sheeting (100 μm thick, 60% porosity), was impregnated by dipping in the varnish and dried for 7 minutes at 150° C., to give an IC chip bonding sheet filled across its entire thickness with epoxy resin to a thickness of 100 μm.

Evaluation

The prepared bonding sheets were tested by evaluation with the thin 10 material vertical burn test of the UL 94 standard, and by measuring for copper foil peel strength in accordance with JIS C6481. The results are shown in Table 1. (Sample pretreatment conditions: pressing at 170° C.×10 kg×90 min.)

TABLE 1

(resin mass parts are all nonvolatile component)

| | Example | | | | | Comparison | |
|---|---|---|---|---|---|---|---|
| | 1 | 2 | 3 | 4 | 5 | 1 | 2 |
| coating method | dip | coat | impreg. | dip | dip | dip | impreg. |
| resin cmpstn | | | | | | | |
| YD-8125 | 60 | 60 | 60 | | 60 | 60 | 60 |
| N-655EXP | | | | 62 | | | |
| LA-7054 | 42 | 42 | 42 | 38 | 42 | 42 | 42 |
| PX-200 | 25 | 25 | 25 | 25 | 100 | | 9 |
| adhesive sheet phosphorus content (% w/w) | 0.33 | 0.26 | 0.14 | 0.33 | 1.3 | 0.0 | 0.5 |

TABLE 1-continued (resin mass parts are all nonvolatile component)

| | Example | | | | | Comparison | |
|---|---|---|---|---|---|---|---|
| | 1 | 2 | 3 | 4 | 5 | 1 | 2 |
| Characteristics | | | | | | | |
| flame retard (UL94) | VTM-0 | VTM-0 | VTM-0 | VTM-0 | VTM-0 | X | X |
| copper foil peel strength (kN · m) | 1.6 | 1.5 | 1.7 | 1.5 | 1.5 | 1.6 | 1.5 |
| PCT test | 1.3 | 1.3 | 1.4 | 1.2 | X | 1.4 | 12 |

Flame retardance (UL94): X denotes outside determined class (burned easily) PCT test: copper foil peel strength sample conditioned at 121° C., 100% humidity, 2 atm for 200 hours, then copper foil peel strength measured again.

As will be apparent from the description and Examples hereinabove, according to the invention, it is now possible to maintain a high level of flame retardance without using bromine in the resin used for the IC chip bonding sheet. Comparing Examples 1 and 5, in Example 1, satisfactory flame retardance is preserved with a smaller flame retardant component content, so humidity resistance is higher, that is bonding reliability is higher. Comparing Example 1 and Comparison 2, despite the low flame retardant component content of Example 1, a high level of flame retardance is preserved, and higher bonding reliability is provided. With a combination of porous polytetrafluoroethylene sheeting and low-flammability resin composition only, it was not possible to provide adequate flame retardance, but by adopting a triple layer structure for the bonding sheet, the amount of adhesive could be reduced and a structure resistant to burning could be obtained. That is, according to the invention, by retaining porous voids in the porous polytetrafluoroethylene layer in the center of the bonding sheet, high flame retardance can be achieved with lower flame retardant component content, and a higher level of humidity resistance, i.e., bonding reliability, can be maintained.

According to the invention, there is now provided an IC chip bonding sheet that while employing bromine-free adhesive resin, nevertheless offers high flame retardance, as well as reliable performance in terms of heat resistance, humidity resistance, resistance to thermal expansion etc., and an IC package employing same.

The invention claimed is:

1. An IC chip bonding sheet comprising
   a. a porous polytetrafluoroethylene layer comprised by at least one porous polytetrafluoroethylene sheet having
      i. porous voids therein
      ii. a first surface
      iii. a second surface, and
   b. an adhesive resin layer comprising a bromine-free flame retardant resin composition on each of said first surface and said second surface, wherein said adhesive resin layer is an adhesive resin sheet comprising a porous polytetrafluoroethylene sheet impregnated with adhesive resin laminated to said porous polytetrafluoroethylene layer;
   c. wherein said adhesive resin layer contains phosphorus; and
   d. wherein total phosphorus content of said IC chip bonding sheet is 0.08-1.0 mass %.

2. The IC chip bonding sheet according to claim 1 wherein said adhesive resin layer is an adhesive resin sheet laminated to said porous polytetrafluoroethylene layer.

3. The IC chip bonding sheet according to claim 1 wherein said flame retardant resin composition has a JIS-K-7201 oxygen index of 25 or greater.

4. The IC chip bonding sheet according to claim 1 wherein said flame retardant resin composition has flame retardance of VTM-1 or higher as measured by UL94 flammability test method.

5. The IC chip bonding sheet according to claim 1 wherein each said adhesive resin layer is 5-70 μm thick.

6. The IC chip bonding sheet according to claim 1 wherein total polytetrafluoroethylene content of said IC chip bonding sheet is 60 mass % or above.

7. An IC bonding sheet comprising a plurality of the IC bonding sheets of claim 1.

8. An IC package comprising an IC chip bonded to a mounting substrate by the IC chip bonding sheet according to claim 1.

* * * * *